United States Patent
Ramus et al.

(10) Patent No.: US 10,666,301 B2
(45) Date of Patent: May 26, 2020

(54) MULTIFREQUENCY DEVICE, CONTROLLING AND/OR MONITORING DEVICE, ASSOCIATED MULTIFREQUENCY SYSTEM AND PIECE OF HOME-AUTOMATION EQUIPMENT

(71) Applicant: SOMFY ACTIVITES SA, Cluses (FR)

(72) Inventors: Michel Ramus, Amancy (FR); Serge Robin, Thorens-Glieres (FR)

(73) Assignee: SOMFY ACTIVITES SA, Cluses (FR)

( * ) Notice: Subject to any disclaimer, the term of this patent is extended or adjusted under 35 U.S.C. 154(b) by 0 days.

(21) Appl. No.: 16/470,983

(22) PCT Filed: Dec. 15, 2017

(86) PCT No.: PCT/EP2017/083131
§ 371 (c)(1),
(2) Date: Jun. 19, 2019

(87) PCT Pub. No.: WO2018/122012
PCT Pub. Date: Jul. 5, 2018

(65) Prior Publication Data
US 2020/0007171 A1    Jan. 2, 2020

(30) Foreign Application Priority Data
Dec. 26, 2016   (FR) .................... 16 63377

(51) Int. Cl.
*H04B 1/00* (2006.01)
*H04B 1/40* (2015.01)
(Continued)

(52) U.S. Cl.
CPC ............. *H04B 1/005* (2013.01); *H03H 7/38* (2013.01); *H04L 12/2803* (2013.01); *H04L 2012/2841* (2013.01)

(58) Field of Classification Search
CPC ........ H04B 1/005; H04B 3/56; H04B 5/0037; H04B 5/0075; H04B 10/0799;
(Continued)

(56) References Cited

U.S. PATENT DOCUMENTS

| 7,883,458 B2 * | 2/2011 | Hamel | A61B 17/32002 600/1 |
| 8,149,108 B2 * | 4/2012 | Hamel | A61B 1/00006 455/343.1 |
| 9,859,933 B2 * | 1/2018 | Ramus | H04B 1/0458 |

FOREIGN PATENT DOCUMENTS

| CN | 101689703 A | 3/2010 |
| CN | 201766715 U | 3/2011 |

(Continued)

OTHER PUBLICATIONS

International Search Report—PCT/EP2017/083131—dated Apr. 11, 2018.

*Primary Examiner* — Quochien B Vuong
(74) *Attorney, Agent, or Firm* — Young & Thompson

(57) ABSTRACT

This multifrequency device (10) is configured to be connected via at least two conductors (121, 122) to an electricity supply grid (11). This device comprises: at least one radiofrequency module (13) comprising at least one first and one second input/output port (131, 132), which ports are able to emit and/or receive radiofrequency signals at two different frequencies; and at least two matching circuits (14, 15) that are configured to block the propagation of radiofrequency signals propagating over the conductors, each matching circuit comprising a plurality of terminals. One terminal (141, 151) of each matching circuit is connected to the first conductor or to the second conductor. One terminal (142, 151) of each matching circuit is connected to the first input/output port or to the second input/output port of the radiofrequency module. This device also comprises decou- (Continued)

pling means (C1, C2) that are configured to stop the propagation of electrical supply signals between the conductors and between at least one conductor and an input/output port of the radiofrequency module.

20 Claims, 2 Drawing Sheets

(51) Int. Cl.
    *H03H 7/38*     (2006.01)
    *H04L 12/28*     (2006.01)

(58) Field of Classification Search
    CPC ........... H04B 2203/5458; H01H 9/167; H01H 9/168; H03H 7/38; H03H 7/40; H03H 11/28; H04L 12/168; H04L 12/2803; H04L 12/2816; H04L 2012/2841
    See application file for complete search history.

(56) References Cited

FOREIGN PATENT DOCUMENTS

| | | |
|---|---|---|
| EP | 2 109 226 | 10/2009 |
| EP | 2 246 932 | 11/2010 |
| FR | 3 028 693 | 5/2016 |

\* cited by examiner

MULTIFREQUENCY DEVICE, CONTROLLING AND/OR MONITORING DEVICE, ASSOCIATED MULTIFREQUENCY SYSTEM AND PIECE OF HOME-AUTOMATION EQUIPMENT

The present invention relates to the field of radio frequency transmission, i.e. of radio signals. The invention more particularly relates to a multifrequency device, a multifrequency control device, home automation equipment, and an associated radio frequency system.

The invention may find an application in the field of home automation and, more particularly, in that of remote control and/or monitoring by radio frequencies. It may, for example, be used in the field of building construction in order to control and/or monitor one or more actuators designed to control at least one electrical load. This electrical load may be intended, for example, for thermal comfort, visual or lighting, sun protection, closure or security of a building or its surroundings.

Such actuators may comprise a receiving radio module for receiving radio control signals from a remote controller. According to an alternative embodiment, these actuators may comprise a transmitter/receiver radiofrequency module for exchanging radio signals with a remote control device. These remote control devices may be, for example, a remote control, a smartphone, a multiservice box, or any other equivalent device. It may be a radiofrequency transmitter, mobile or fixed.

The radiofrequency module may comprise at least one antenna in order to increase the sensitivity and therefore the transmission range between the transmitter, respectively the receiver, of the remote control device and the receiver, respectively the transmitter, of the radiofrequency module.

In some embodiments, the actuator is arranged in a metal housing, which causes the antenna to be moved out of the metal housing to maintain sensitivity. However this solution is not very aesthetic. In addition, when the antenna is made in the form of a wire, an installer seeing an unconnected wire may be tempted to cut it thinking that this wire is not in use.

It is known to use a conductor of a power supply cable of a radiofrequency module to form part of the antenna of this module, either by direct coupling or by partial coupling. For reasons of ease and safety, the conductor used is usually the neutral conductor. A problem arises when it is desired to make a device using at least two different frequencies for transmitting and/or receiving radio frequency signals. In this case, several antennas are required and the use of the mains power cable as an antenna would require the use of at least one phase conductor. Due to the voltage of the power supply network, namely 330V peak or 170V peak depending on the country, the use of a phase conductor connected to the power grid would not be without risk for the electrical components and users.

An object of the invention is, in particular, to overcome all or part of the aforementioned drawbacks by providing a multifrequency device that is designed to receive and/or transmit radio signals on several different frequencies and use a mains cable as antenna. The invention also aims to provide a multifrequency control device, an item of home automation equipment, and an associated radiofrequency system.

For this purpose, the object of the invention is a multifrequency device designed to be connected by at least a first and a second conductor to a power supply network, wherein the device comprises:

at least one radiofrequency module comprising at least a first and a second input/output port, wherein the first input/output port is able to transmit and/or receive radio frequency signals on a first frequency, while the second input/output port is suitable to transmit and/or receive radiofrequency signals on a second frequency distinct from the first frequency, at least a first and a second tuning circuit designed to block the propagation of radiofrequency signals propagating respectively on the first and the second conductor, wherein each tuning circuit comprises a plurality of terminals,
  wherein a terminal of each tuning circuit is connected respectively to the first conductor or to the second conductor,
  and wherein a terminal of each tuning circuit is respectively connected to the first input/output port or to the second input/output port of the radio frequency module, decoupling means designed to stop the propagation of electrical power signals between the first and second conductors and between at least one conductor and an input/output port of the radio frequency module.

Thanks to the invention, reception of radio signals is possible on at least two different frequencies, while the radiofrequency module is protected against a current surge from the power supply network.

According to advantageous but non-mandatory aspects of the invention, such a multifrequency device may incorporate one or more of the following features taken according to any technically feasible combination:

The first tuning circuit comprises at least three terminals, wherein a first terminal of the first tuning circuit is connected to the first conductor, a second terminal of the first tuning circuit is connected to the first input/output port of the radiofrequency module via a decoupling capacitor, and wherein a third terminal of the first tuning circuit of the tuning circuit is connected to an electrical ground of the multifrequency device via a decoupling capacitor.

The first tuning circuit comprises, between the first and third terminals, an inductance connected in parallel with a capacitor, while the second terminal of the first tuning circuit is connected to a point of the inductance located between its two ends.

The first tuning circuit comprises, between the first and third terminals, an inductance connected in parallel with two capacitors connected in series, while the second terminal of the first tuning circuit is connected to the terminal common to the two capacitors.

The second tuning circuit is formed by a transmission line whose length is substantially equal to one quarter of the wavelength associated with the second frequency, wherein a first terminal of the second tuning circuit is connected to a first end of the transmission line, while the second conductor and the second input/output port of the radiofrequency module and a second terminal of the tuning circuit are connected to a second end of the transmission line and to the electrical ground of the multifrequency circuit.

The first end of the transmission line is connected to the second input/output port of the radiofrequency module via an impedance matching circuit designed to adapt the impedance of the second conductor to a value substantially equal to the input impedance of the second input/output port of the radio frequency module.

The first tuning circuit is also designed to adapt the impedance of the first conductor to a value substantially equal to the input impedance of the first input/output port of the radio frequency module.

The first tuning circuit comprises an inductance in the form of printed coils.

The radio frequency module is designed to transmit and/or receive radio frequency signals on a single frequency.

The radiofrequency module is designed to transmit and/or receive radio frequency signals on at least two frequencies.

The first and second conductors, connected to the power supply are respectively a phase conductor and a neutral conductor.

One of the conductors connected to the power supply is a ground conductor.

The invention also relates to a radio frequency control and/or monitoring device designed to supply at least one electric load, wherein the control and/or monitoring device is characterized in that it comprises at least one multifrequency device like that mentioned above and a control and/or monitoring module.

In addition, the invention relates to an item of home automation equipment designed to be controlled and/or monitored by radio frequency signals, wherein the item of home automation equipment is characterized in that it comprises a device for control and/or monitoring by radio frequency signals as mentioned above for controlling and/or monitoring an electric load also belonging to the home automation equipment.

Finally, the invention relates to a multifrequency system comprising a group of at least one item of home automation equipment as mentioned above, and a group of at least one remote control and/or monitoring device, wherein the multifrequency system is characterized in that the group of at least one remote control and/or monitoring device comprises a radio frequency module designed to cooperate with at least one multifrequency device of the group of at least one item of home automation equipment, in order to control and/or monitor it.

Other features and advantages of the present invention will appear more clearly upon reading the following description, given by way of illustration and not limitation, and with reference to the accompanying drawings, wherein:

FIG. 1 represents an exemplary embodiment of a multifrequency device 10 according to the invention.

Figure 1:
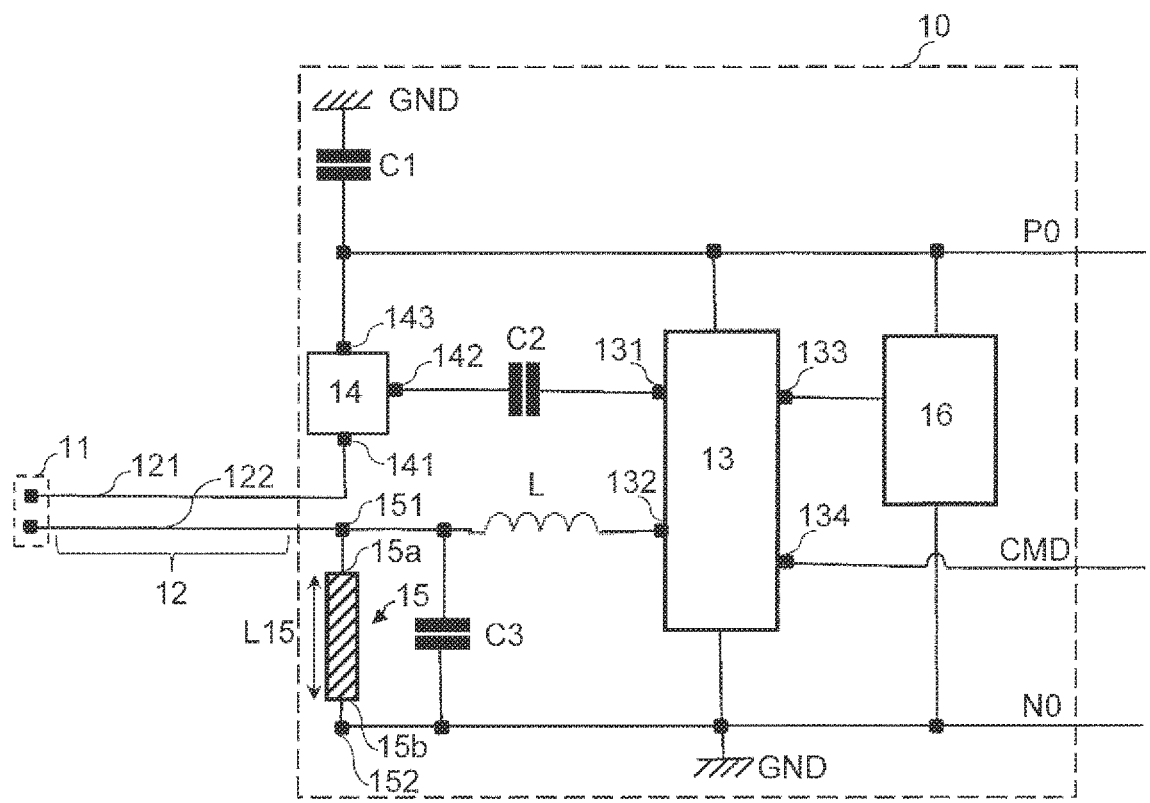
FIG. 1 shows an exemplary embodiment of a multifrequency device according to the invention.

The device 10 is designed to be connected to a power supply network 11, i.e. a commercial AC network, via a mains cable 12. The power supply network 11, or mains may, for example, be a single-phase network or a three-phase electrical network. By way of example, a single-phase electrical network can supply an effective voltage with an amplitude equal to approximately 230V or 120V, with a frequency of approximately 50 Hz or 60 Hz. A three-phase electrical network can supply an effective voltage of about 380 V or 230 V amplitude between each of the phase conductors and an effective voltage of magnitude equal to about 120 V or 230 V between each phase conductor and the neutral conductor.

The mains cable 12 comprises a group of at least two conductors 121, 122. In the embodiment illustrated FIG. 1, the mains cable comprises a phase conductor 121 and a neutral conductor 122. According to an alternative embodiment, the group of at least two conductors may comprise two or three phase conductors. According to another embodiment, the mains cable may comprise a protective conductor connected to the ground. These conductors may also constitute first and second conductors, within the meaning of the invention.

Each conductor of the mains cable 12 behaves like an antenna. The electrical signals propagating on one or more conductors of the mains cable 12 thus comprise two components, a first low frequency component (typically of 50 Hz or 60 Hz frequency) corresponding to the electrical supply signals and a high frequency radio frequency component corresponding to the radio signals picked up by the mains cable and being propagated on the conductors of the latter.

The multifrequency device 10 comprises an electrical GND mass.

The multifrequency device 10 may be either a unidirectional type that is purely receiver or purely transmitter, or a bidirectional type i.e. transmitter and receiver, or a mixed type. For this, it comprises at least one radiofrequency module 13 that is able to transmit and/or receive radio frequency signals on at least two frequencies of different values. The radiofrequency module 13 may be designed to transmit and/or receive radio frequency signals at one or more frequencies, in order to exchange radio frequency signals with another remote transmission and/or reception device. The radiofrequency module 13 comprises at least two input/output ports 131, 132, wherein a first input/output port 131 is designed to at least receive radio frequency signals at a first frequency, while the second input/output port 132 is designed to receive at least one radiofrequency signals on a second frequency that is distinct from the first frequency. In the case of a mixed multifrequency device, part of the input/output ports may be of unidirectional type and another part may be of the bidirectional type.

The radio frequency module comprises a control output 134 designed to transmit electrical control signals to a load not shown, such as a shutter motor not shown.

According to one embodiment, the radiofrequency module 13 may comprise an input/output port designed to at least receive signals such as electronic signals representative of one or more state variables. In one embodiment, this input/output may be bidirectional and designed to transmit and receive electrical signals to and from another device.

In order not to overload the figure, only the input/output ports 131, 132 of the radio frequency module 13 have been represented. The radio frequency module comprises other elements known to those skilled in the art as a power supply device, a high frequency amplifier-demodulator circuit, one or more microcontrollers or processors and/or any other equivalent means programmed in an appropriate manner. As a result, the radio frequency module 13 is able to receive and decode signals representative of control commands and possibly to emit signals representative of information.

The radio frequency module 13 comprises an electrical ground connected to the GND electrical ground of the multifrequency device 10.

The radio frequency module 13 may be powered from the voltage supplied by the mains, for example, by a power supply input 133 connected between an internal phase line P0 and an internal neutral line N0. In this embodiment (not shown), the radiofrequency module 13 may comprise an internal power supply device designed to transform the alternating voltage, for example with an amplitude substantially equal to 230 V and of frequency 50 Hz, supplied by the electrical network 11, into an internal voltage, for example with a continuous amplitude substantially equal to 3V, used for supplying the various electronic components of the radio frequency module 13.

According to another embodiment shown in FIG. 1, the multifrequency device 10 may comprise a power supply device 16 connected between an internal phase line P0 and an internal neutral line N0 and intended to supply the radio frequency module 13 with a voltage lower than that of the mains. For this, the power input 133 of the radio frequency module 13 may be connected to a power supply output 161 of the power supply device 16.

Figure 2:
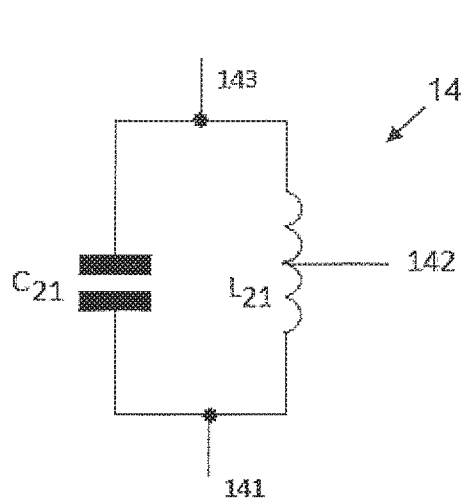
FIGS. 2 and 3 show examples of embodiments of a tuning circuit used in the device of FIG. 1.
Figure 3:
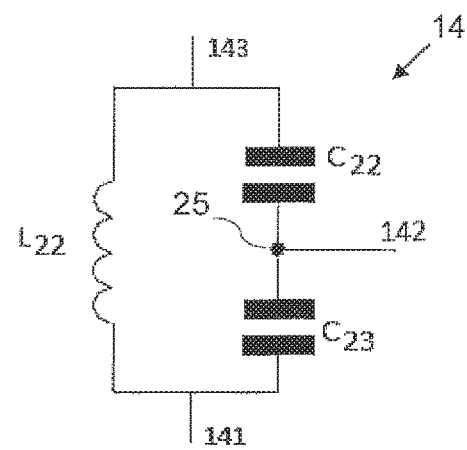

The multifrequency device comprises a first tuning circuit 14 designed to limit the propagation of radiofrequency signals on the conductor 121, 122 to which it is connected. Referring to FIGS. 2 and 3, the tuning circuit 14 comprises at least one coil and a capacitor connected in parallel forming a resonant circuit or isolation circuit (also known as "trap circuit"). The coil and capacitor of the tuning circuit are so dimensioned that the resonant circuit is tuned to a frequency substantially equal to the frequency of the signals of the carrier used for the radio frequency transmission.

This first tuning circuit 14 may also have a second impedance matching function. In this embodiment, the various components of this circuit 14 are also dimensioned in order to adapt the impedance of the conductor to which it is connected, as seen at the level of the first input/output port 131 of the radiofrequency module 13, to a value substantially equal to that of the input impedance of this first input/output port 131. The value of this impedance may for example be equal to 50 Ohms.

According to one embodiment, the multifrequency device 10 may be implanted on a printed circuit board (PCB). The circuit board may be a double-sided card. One side of the card may be fully or partially metallized to form a ground plane.

According to one embodiment, the coil L21, L22 of the tuning circuit 14 may be a printed inductance. The inductance L21, L22 may be embodied as printed coils.

The tuning circuit 14 comprises three terminals referenced 141, 142, 143. A first terminal 141 of the tuning circuit 14 is connected to the first conductor 121 connected to the power supply network. A second terminal 142 of the tuning circuit is connected to the first input/output port 131 of the radio frequency module 13 via a decoupling capacitor C2. The decoupling capacitor C2 makes it possible to block the propagation of the signals of lower frequency at a predetermined frequency, or cut-off frequency, and to allow the propagation of the frequency signals higher than this predetermined frequency. Advantageously, the value of this capacitor C2 is thus chosen in order to block the propagation of the low-frequency power supply electrical signals, i.e. the frequency of which is substantially equal to that of the electrical supply network, for example 50 Hz or 60 Hz. For a voltage of 230V, this capacitor C2 may have, for example, a value of 68 pF with a service voltage substantially equal to 1000V.

The tuning circuit 14 produces a voltage collector for the input/output port 131 of the radio frequency module 13 to which it is connected and must be referenced to the electrical ground of the multifrequency device 10. In order not to make a short circuit between the second conductor 122 and GND electrical ground at low frequencies, the third terminal 143 of the tuning circuit 14 is connected to the GND electrical ground of the multifrequency device 10 via a decoupling capacitor C1. Advantageously, the decoupling capacitor C1 makes it possible to prevent the propagation of the power supply signals to the electrical ground. For example, the capacitor C1 may have a value of 68 pF and a service voltage substantially equal to 1000V.

The third terminal 143 of the tuning circuit 14 is connected as close as possible to the GND electrical ground. The distance between the connection point and the tuning circuit 14 is lower, preferably much lower, than a quarter of the wavelength associated with the frequency to which the tuning circuit is tuned. By "much lower" is meant at least, ten times even a hundred times, lower.

According to a first embodiment, illustrated in FIG. 2, the tuning circuit 14 comprises a coil or inductance L21 and a capacitor C21 connected in parallel. The second terminal 142 of the tuning circuit 14 is connected to the inductance L21 at a point between the two ends of the inductance. In this embodiment, the inductance L21 is fictitiously divided into two coupled coils placed in series, wherein the second terminal 142 is connected to the common terminal of these two coils.

FIG. 3 represents a second embodiment of a tuning circuit comprising an inductance L22 and two capacitors C22, C23. The two capacitors are connected in series, while the second terminal 142 of the tuning circuit 14 is connected to the common point 25 of these two capacitors.

The multifrequency device 10 comprises a transmission line 15 whose length L15 is substantially equal to one quarter of the wavelength associated with the second frequency. This type of transmission line 15 is generally called a quarter-wave line. A first terminal 151 of the tuning circuit 15 is connected to a first end 15a of the transmission line 15, to the second input/output port 132 of the radiofrequency module 13, and to the second conductor 122 of the mains cable 12 connected to the supply network 11. A second terminal 152 of the tuning circuit 15 is connected to a second end 15b of the transmission line 15 and to the GND electrical ground of the multifrequency device 10.

The length L15 is measured between the two ends 15a and 15b of the transmission line 15.

For signals having a frequency substantially equal to the second frequency, the quarter-wave line is equivalent to a parallel resonant circuit. This quarter-wave line thus forms a second tuning circuit for the multifrequency device. At this frequency, the quarter-wave line thus has a very high impedance at its first end 151, theoretically infinite, i.e. an open circuit. For radio signals with a frequency substantially equal to this frequency and circulating on the second conductor 122, the propagation is therefore directly to the second input/output port 132 of the radiofrequency module 13.

At low frequencies, typically for electrical supply signals, the transmission line 15 allows an electrical connection between the first conductor 121 and the GND electrical ground of the multifrequency device 10.

The transmission line 15 thus forms a tuning circuit for the signals being propagated on the second conductor 122. In this embodiment, the first terminal 151 of this tuning circuit 15 is connected to both the first end 15a of the transmission line 15, the conductor 122, and the input/output port 132.

In practice, the terminal 151 and the end 15a may be merged, as well as the terminal 152 and the end 15b.

According to one embodiment, the multifrequency device 10 may comprise an inductance L connected in series between the second input/output port 132 of the radio frequency module 13 and the first end 151 of the transmission line 15. The multifrequency device 10 may also comprise a capacitor C3 connected between the second conductor 122 and GND electrical ground. Advantageously, the inductance L and the capacitor C3 allow impedance matching. The value of the inductance L and that of the capacitor C3 are chosen in order to adapt the impedance of the second conductor 122, as seen at the second input/output port 132 of the radio frequency module 13, to a value substantially equal to that of the input impedance of this second input/output port 132. The value of this impedance may, for example, be equal to 50 Ohms. As an illustration, the inductance L may have a value of 1 nH and the capacitor C3 a value of 0.7 pF.

Similarly, one can imagine a multifrequency device 10 designed to be connected to a polyphase electrical network, such as a three-phase network, via a mains cable 12 comprising a neutral conductor and several phase conductors. In this case the device may comprise several tuning circuits 14, it may comprise as many tuning circuit(s) as phase conductor(s) used to propagate radio frequency signals. Similarly, the multifrequency circuit may comprise one or more radio frequency modules 13 in order to have enough input/output ports to process the different radio frequency signals.

Advantageously, the invention makes it possible to receive and/or transmit radio frequency radio signals between the air environment and a multifrequency device 10 connected to an alternating electric supply network 11 via a mains cable 12 for which at least two conductors act as receiving and/or transmitting antennas of indefinite length. It allows, for any transmitter and/or receiver of orders connected to the mains, to receive or transmit orders transmitted by airwaves using as transmit and/or receive antenna an indeterminate portion of mains cable 12 in the vicinity of the point of connection to the mains 11.

The invention is particularly interesting in a frequency range greater than 100 MHz.

Figure 4:
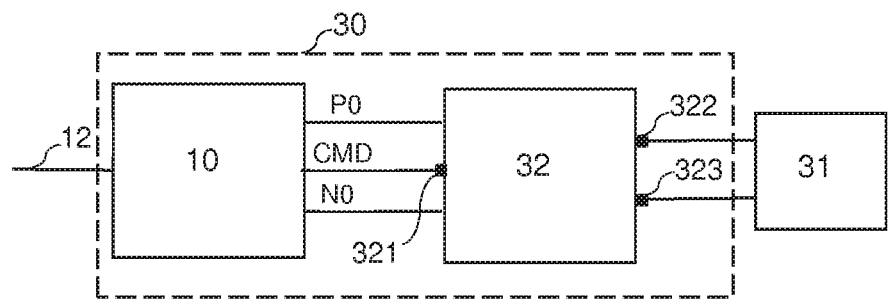
FIG. 4 shows an exemplary embodiment of a multifrequency control and/or monitoring device according to the invention.

FIG. 4 represents an exemplary embodiment of a radio frequency signal multifrequency control and/or monitoring device 30 according to the invention, designed to control and/or monitor an electric load 31 to which it is connected, for example a motor. The multifrequency control and/or monitoring device 30 comprises at least one multifrequency device 10, as defined previously, and a control and/or monitoring module 32.

The control and/or monitoring module 32 may comprise a control port 321 connected to the control output 134 of the radio frequency module 13, for example, via a command line CMD.

The control commands generated by the radio frequency module 13 give rise to electrical signals representative of these control commands. These signals are then transmitted to the control and/or monitoring module 32, for example via the control port 321, in order to be processed by the control and/or monitoring module 32. After processing, the control and/or monitoring module generates signals representative of control of the electric load which are then transmitted to this electric load 31. It may be, for example, a motor whose output drives a movable element when the motor is powered up. These signals may for example be available at a control port 322 of the control and/or monitoring module 32.

The control and/or monitoring module 32 may comprise a control port 323 connected to an output of the electric load 31. These inputs and outputs are designed to pass signals representative of state variables in order to control the electric load 31 connected to the multifrequency control and/or control device 30. In a variant, the inputs and outputs are designed for passing signals representative of state variables in order to control several load-like electric loads 31 connected to the device 30.

The various control ports 321, 323 and the control port 322 may be unidirectional or bidirectional type ports.

The control and/or monitoring module 32 may be made of a single module designed to implement the two control and monitoring functions, or be made of two separate modules each providing a regulation or monitoring function.

The control and/or monitoring module 32 may be connected to the power supply network by an internal phase line P0 and by an internal neutral line NO.

By way of illustration, in the exemplary embodiment of FIG. 1, the internal phase line P0 is connected to the phase conductor 121 of the mains cable via the tuning circuit 14, while the internal neutral line NO is connected to the neutral conductor 122 of the mains cable via the transmission line 15.

In the case where the electric load 31 is a motor comprising a first, a second and a third motor terminal, a control portion of the control and/or monitoring module 32 may be formed by a switching unit consisting simply of relays enabling connection of the internal phase line P0 and the internal neutral line NO to some terminals of the motor. The three terminals of the motor may be connected to the control port 322 of the control and/or monitoring module 32, for example by means of a cable comprising three conductors, wherein each of the conductors is connected to one of the motor terminals.

In the case where the electric load 31 is a single-phase induction-type motor, the switching unit may be designed to allow the connection of the internal phase line P0 to either the first motor terminal or the second motor terminal, according to the desired direction of rotation, while connecting the third motor terminal to the internal neutral line NO.

In the case where the electric load 31 is a synchronous brushless motor type autopilot, the switching unit may comprise a rectifier followed, for example, by a three-phase inverter whose three outputs are connected to the three motor terminals. The rectifier may also be dissociated from the switching module.

In the case where the electric load 31 is a DC type motor with a collector, the third motor terminal does not exist. The switching unit may comprise a rectifier, while the two output terminals are connected by relay either to the first motor terminal and to the second motor terminal, or by reversing the connection of these two terminals, depending on the direction of rotation of the desired motor.

When the power cable 12 connected to the control device and/or control is traversed by a current, the tuning circuit 14 is traversed by a current I formed by at least two components. A first component is a low-frequency alternating current, for example with a frequency 50 Hz or 60 Hz, for supplying the electric load 31 connected to the control and monitoring device. Its intensity may be variable depending on the mode of activity of the electric load, especially when the load is a motor. A second component is a high frequency radio frequency component corresponding to the radio signals being propagated on a conductor 121 of the cable 12 to which the tuning circuit 14 is connected.

Between the first terminal 141 and the third terminal 143 of the tuning circuit 14, the high frequency radio frequency component of the current is blocked by the parallel resonant circuit contained in the tuning circuit 14. In addition, because of the connection of the circuit matched with the GND electrical ground, the high-frequency radio frequency component taken from the parallel resonant circuit at the second terminal 142 is not disturbed by the consumption of the connected electrical load 31, such as, for example, a motor whose intensity is variable according to its mode of activity.

Embodiments of the tuning circuit 14 other than those shown in FIGS. 2 and 3 are possible within the scope of the invention, provided that the tuning circuit 14 may be directly traversed by the low frequency component of the current until it blocks the propagation of the high frequency radio frequency component within the current supplying the electric load.

The device 30 for control and/or multifrequency control is presented above by an example of application to the control and/or monitoring of a motor. This example is in no way limiting. The device 30 may be associated with other electrical loads, such as a lighting system, a heating control system, an alarm system, a video system, etc.

Figure 5:
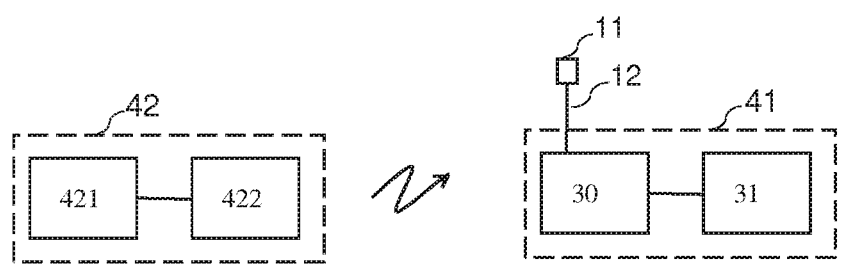
FIG. 5 shows an exemplary embodiment of a multifrequency system according to the invention.

FIG. 5 represents an exemplary embodiment of a multifrequency system 40 according to the invention. This system may, for example, form all or part of a home automation system.

The system 40 comprises a group of at least one item of a home automation equipment 41 designed to be connected, by a mains cable 12 comprising at least two conductors of the type of the conductors 121, 122 visible in FIG. 1, to a power supply network 11 and to be controlled and/or monitored by radio frequency signals.

The item of home automation equipment 41 may be an actuator arranged to move or adjust an element of a building, for example an actuator for moving a shutter or a blind, a control system for a heater or a ventilation system. Home automation equipment may also be lighting, for example indoor or outdoor lighting such as terrace lighting, a lighting control system, an alarm system, a video camera, in particular a video surveillance camera, etc.

The home automation equipment 41 comprises multifrequency a control and/or monitoring device 30 as described above.

The system 40 also comprises one or more remote control and/or monitoring devices 42 comprising a radio frequency module 421 designed to cooperate with at least one multifrequency device 10 of the group of at least one item of home automation equipment 41, in order to control and/or monitor it.

The remote control and/or monitoring device 42 may be a command transmitter comprising, for example, a control keyboard 422 and a radio frequency module 421, such as a radio frequency transmitter.

It may also be a sensor, for example designed to regulate a state variable such as temperature, light intensity, pressure, etc., of a presence detection sensor, a weather sensor, an air quality sensor, or alarm. These different types of sensor may be likened to remote control and/or monitoring devices 42, even if they only transmit signals representative of measurement data.

The radio frequency module 421 may be a unidirectional module designed only to transmit, a bidirectional module designed to transmit and receive radio frequency signals, or a mixed module comprising, for example, several channels, wherein some channels are designed to transmit only radio frequency signals while other channels are designed to both transmit and receive radio frequency signals.

With reference to FIG. 5, the remote control and/or monitoring device 42 communicates via radio frequency signals with a home automation device 41. It may be an actuator comprising a motor.

The control pad 422 of the remote control and/or monitoring device 42 comprises control keys. According to the activated key, the radio frequency module 421 transmits radio frequency signals representative of a command order, for example a movement order in a first direction, a movement order in a second direction, or a stop command. The control and/or monitoring device 30 of the home automation equipment 41 receives the signals representative of the commands issued by the remote control and/or monitoring device 42 and transforms them, if necessary, into motor control commands for the electric load actuator 31.

The output of the actuator is connected to a movable element that can move in several directions according to the control applied to the motor. The movable element may be installed in a building or its surroundings and move in a space of the building, for example in front of a bay, on a terrace, etc. It may actuate, for example, a shutter, a blind, a garage door, a gate . . . .

The home automation equipment 41 and the remote control and/or monitoring device 42 may be of the one-way type, i.e. only providing the reception function or providing only the transmission function, or the bidirectional type, i.e. providing both transmitting and receiving functions.

By way of example, a remote control and/or monitoring device 42 may emit radio frequency signals representative of a command, for example the lifting of blinds. Upon reception, the multifrequency control and/or monitoring device 30 processes these radio frequency signals and supplies control signals towards the connected electrical load 31 in order to execute the requested command. In return, the multifrequency control and/or monitoring device 30 may transmit radio frequency signals towards the remote control and/or monitoring device 42. These signals may be, for example, signals that are representative of an "acknowledgment of receipt" to confirm receipt of the command. They may also be signals representative of a message confirming the correct execution of the command, for example when an awning is lifted.

Various examples of uses of the multifrequency device 10 and the radio frequency control and/or monitoring device 30 are presented hereinafter.

Depending on the country, the items of home automation equipment 41 that may be controlled and/or remotely monitored via radio frequency signals do not all operate on the same frequency. This obliges manufacturers to develop and manufacture multifrequency control and/or monitoring devices using different radio signals. Advantageously, the present invention can simplify, for example, the design of these devices, as well as inventory management.

As previously stated, by design, the radio frequency module 13 is able to transmit and/or receive radio frequency signals on several frequencies of different values, for example on an integer n of frequencies with n greater than or equal to two. According to a first mode of use of the device 30 for controlling and/or monitoring radio frequency signals, the radio frequency module 13 may be designed to transmit and/or receive radio frequency signals over a number of frequencies strictly less than n.

By way of non-limiting example, the radio frequency module 13 may be a dual frequency module capable of receiving or transmitting and receiving radio frequency signals at the frequencies of 868 MHz and 2.4 GHz. Before being mounted in an item of home automation equipment 41, the radio frequency module 13 may be designed to operate on only one of these two frequencies corresponding to a frequency used in the country or countries of destination. This configuration may, for example, be performed during the programming of the radio frequency module 13. These frequency values are in no way limiting and other frequencies may be used such as, for example, the frequency of 433 MHz.

Thus, the manufacturer is no longer obliged to design as many multifrequency devices as frequencies of use, as a single device may cover all possible frequencies. Similarly, the same assembly line may be used to mount all items of home automation equipment, regardless of the country of destination.

According to an alternative embodiment of the radio frequency control and/or monitoring device according to the invention, the radio frequency module 13 may be designed to transmit and/or receive radio frequency signals on n frequencies, with an integer n greater than or equal to equal to two. Home automation equipment may, for example, be designed to be controllable from two types of radio frequency signals of different frequencies. It may be, for example, a gate actuator, garage door, roller shutter, controllable by a remote control device such as a remote control transmitting on a first frequency or a remote control mobile phone application transmitting on this first frequency. In the event of strong electromagnetic disturbances around this first frequency, the remote control may have difficulty controlling the actuator. This may be the case with the 2.4 GHz frequency which is also used for other applications such as Wi-Fi. In this case, the user may use a second remote control device, such as a second remote control, transmitting on a second frequency or another channel of the same remote control device, if it is multi-frequency. The control and/or monitoring device 30 may be controlled on two separate frequencies, depending on needs.

This multifrequency control device 40 may also be used in the case where the range of the remote control device becomes insufficient to control an item of remote home automation equipment on a first frequency. In this case, the user may use another remote control device or another channel operating on a second higher frequency on the same remote controller.

Such a multifrequency control and/or monitoring device 30 may be used in an item of home automation equipment 41, wherein a first frequency is used to control the home automation equipment at a distance and a second frequency is used to control the equipment remotely. To do this, the radio frequency module 13 may comprise a first input/output port operating only in reception or transmission/reception in order to provide the remote control function, and a second input/output port of the bidirectional type for regulating the home automation equipment 41 in which the device 30 is mounted.

According to another mode of use, an item of home automation equipment 41 in which a multifrequency control and/or monitoring device 30 is installed, may communicate over several frequencies for redundancy and/or security purposes. Such a mode of use may, for example, find use in a multifrequency alarm system connected to the electrical network.

The various embodiments and variants defined above that are not incompatible may be combined to generate new embodiments of the invention, in the context of the appended claims.

The invention claimed is:

1. Multifrequency device designed to be connected by at least first and second conductors to a power supply network, wherein the device comprises:
   at least one radio frequency module comprising at least a first and a second input/output port, wherein the first input/output port is able to transmit and/or receive radio frequency signals at a first frequency, while the second input/output port is able to transmit and/or receive radio frequency signals on a second frequency that is distinct from the first frequency,
   at least first and second tuning circuits designed to block the propagation of radio frequency signals being propagated respectively on the first and second conductors, wherein each tuning circuit comprises a plurality of terminals:
      wherein a terminal of each tuning circuit is respectively connected to the first conductor or to the second conductor,
      wherein a terminal of each tuning circuit is respectively connected to the first input/output port, or to the second input/output port of the radio frequency module,
   decoupling means designed to stop the propagation of electrical supply signals between the first and second conductors and between at least one conductor and an input/output port of the radio frequency module.

2. Device according to claim 1 wherein the first tuning circuit comprises at least three terminals, wherein a first terminal of the first tuning circuit is connected to the first conductor, a second terminal of the first tuning circuit is connected to the first input/output port of the radio frequency module via a decoupling capacitor, and a third terminal of the first tuning circuit of the tuning circuit is connected to an electrical ground of the multifrequency device via a decoupling capacitor.

3. Device according to claim 2 wherein the first tuning circuit comprises, between the first and third terminals, an inductance connected in parallel with a capacitor, while the second terminal (142) of the first tuning circuit is connected at a point of the inductance between its two ends.

4. The device according to claim 3, wherein the second tuning circuit is formed by a transmission line whose length is substantially equal to one quarter of the wavelength associated with the second frequency, wherein a first terminal of the second circuit is connected at a first end of the transmission line to the second conductor and the second input/output port of the radio frequency module, while a second terminal of the tuning circuit is connected to a second end of the transmission line and to the electrical ground of the multifrequency circuit.

5. The device according to claim 3, wherein the first tuning circuit is also designed to match the impedance of the first conductor at a value substantially equal to the input impedance of the first input/output port of the radio frequency module.

6. Device according to claim 2 wherein the first tuning circuit comprises, between the first and third terminals, an inductance connected in parallel with two capacitors connected in series, while the second terminal of the first tuning circuit is connected to the common terminal of the two capacitors.

7. The device according to claim 6, wherein the second tuning circuit is formed by a transmission line whose length is substantially equal to one quarter of the wavelength associated with the second frequency, wherein a first terminal of the second circuit is connected at a first end of the transmission line to the second conductor and the second input/output port of the radio frequency module, while a second terminal of the tuning circuit is connected to a second end of the transmission line and to the electrical ground of the multifrequency circuit.

8. The device according to claim 2, wherein the second tuning circuit is formed by a transmission line whose length is substantially equal to one quarter of the wavelength associated with the second frequency, wherein a first terminal of the second circuit is connected at a first end of the transmission line to the second conductor and the second input/output port of the radio frequency module, while a second terminal of the tuning circuit is connected to a second end of the transmission line and to the electrical ground of the multifrequency circuit.

9. The device according to claim 2, wherein the first tuning circuit is also designed to match the impedance of the first conductor at a value substantially equal to the input impedance of the first input/output port of the radio frequency module.

10. Device according to claim 1 wherein the second tuning circuit is formed by a transmission line whose length is substantially equal to one quarter of the wavelength associated with the second frequency, wherein a first terminal of the second circuit is connected at a first end of the transmission line to the second conductor and the second input/output port of the radio frequency module, while a second terminal of the tuning circuit is connected to a second end of the transmission line and to the electrical ground of the multifrequency circuit.

11. Device according to claim 10 wherein the first end of the transmission line is connected to the second input/output port of the radio frequency module via an impedance matching circuit designed to match the impedance of the second conductor at a value substantially equal to the input impedance of the second input/output port of the radio frequency module.

12. Device according to claim 1 wherein the first tuning circuit is also designed to match the impedance of the first conductor at a value substantially equal to the input impedance of the first input/output port of the radio frequency module.

13. Device according to claim 1 wherein the first tuning circuit comprises an inductance made in the form of printed coils.

14. Device according to claim 1 wherein the radio frequency module is designed to transmit and/or receive radio frequency signals on a single frequency.

15. Device according to claim 1 wherein the radio frequency module is designed to transmit and/or receive radio frequency signals on at least two frequencies.

16. Device according to claim 1 wherein the first and the second conductors, connected to the power supply network are respectively a phase conductor and a neutral conductor.

17. Device according to claim 1 wherein one of the conductors, connected to the power supply network, is a ground conductor.

18. Device for control and/or monitoring by radio frequency signals, designed to supply at least one electric load, wherein the control and/or monitoring device comprises at least a multifrequency device according to claim 1, and a module for control and/or monitoring.

19. Home automation equipment designed to be controlled and/or monitored by radio frequency signals, wherein the home automation equipment comprises a device for controlling and/or monitoring radio frequency signals according to claim 18 for controlling and/or monitoring an electric load also belonging to the home automation equipment.

20. Multifrequency system comprising a group of at least one item of home automation equipment according to claim 19 and a group of at least one remote controlling and/or monitoring device, wherein the group of at least one remote controlling and/or monitoring device comprises a radio frequency module designed to cooperate with at least one multifrequency device of a group of at least one item of home automation equipment, in order to control and/or monitor it.

* * * * *